(12) United States Patent
Plevridis et al.

(10) Patent No.: US 9,142,877 B2
(45) Date of Patent: Sep. 22, 2015

(54) CONTROL OF A TRANSMITTER OUTPUT POWER

(75) Inventors: Sofoklis Plevridis, Glyfada (GR); Anastasios Karakasiliotis, Athens (GR); Radhakrishnan Kuzhipatt, Irvine, CA (US); Kai Xie, North Brunswick, NJ (US)

(73) Assignee: BROADCOM CORPORATION, Irvine, CA (US)

( * ) Notice: Subject to any disclaimer, the term of this patent is extended or adjusted under 35 U.S.C. 154(b) by 467 days.

(21) Appl. No.: 13/537,331

(22) Filed: Jun. 29, 2012

(65) Prior Publication Data

US 2013/0260816 A1 Oct. 3, 2013

Related U.S. Application Data

(60) Provisional application No. 61/618,049, filed on Mar. 30, 2012.

(51) Int. Cl.
| | | |
|---|---|---|
| H04W 52/22 | (2009.01) | |
| H04B 1/04 | (2006.01) | |
| H01Q 1/24 | (2006.01) | |
| H03H 7/40 | (2006.01) | |

(52) U.S. Cl.
CPC *H01Q 1/243* (2013.01); *H03H 7/40* (2013.01)

(58) Field of Classification Search
CPC ......... H04B 1/04; H04W 4/00; H04W 52/32; H04W 52/325
See application file for complete search history.

(56) References Cited

U.S. PATENT DOCUMENTS

| | | | | |
|---|---|---|---|---|
| 8,688,865 | B2* | 4/2014 | Luo | 710/8 |
| 2002/0127980 | A1* | 9/2002 | Amanullah et al. | 455/127 |
| 2006/0033551 | A1* | 2/2006 | Dong et al. | 327/427 |
| 2007/0274237 | A1* | 11/2007 | Li et al. | 370/278 |
| 2009/0270137 | A1* | 10/2009 | Sorensen et al. | 455/572 |
| 2012/0113878 | A1* | 5/2012 | Yu et al. | 370/311 |
| 2012/0249064 | A1* | 10/2012 | Negishi et al. | 320/108 |
| 2012/0264378 | A1* | 10/2012 | Steele et al. | 455/73 |
| 2013/0257667 | A1* | 10/2013 | Kang | 343/749 |
| 2013/0259093 | A1* | 10/2013 | Kuo | 375/145 |
| 2013/0259109 | A1* | 10/2013 | Liu et al. | 375/227 |
| 2013/0259176 | A1* | 10/2013 | Moorthy et al. | 375/349 |
| 2013/0281101 | A1* | 10/2013 | Yu et al. | 455/450 |
| 2013/0288651 | A1* | 10/2013 | Chen et al. | 455/414.1 |

* cited by examiner

Primary Examiner — Bobbak Safaipour
(74) Attorney, Agent, or Firm — McDermott Will & Emery LLP (57) ABSTRACT

Disclosed are various embodiments for controlling an output power of a transmitter. Adjustment amounts for a transmitter to transmit at a desired power level are determined. For a predetermined time period, an actual power level of the transmitter is adjusted at a first adjustment rate. Upon an expiration of the predetermined time period, the actual power level is adjusted at a second adjustment rate, wherein the second adjustment rate is slower than the first adjustment rate.

20 Claims, 6 Drawing Sheets

CONTROL OF A TRANSMITTER OUTPUT POWER

CROSS REFERENCE TO RELATED APPLICATIONS

This application claims priority to U.S. provisional application entitled "CELLULAR BASEBAND PROCESSING" assigned Ser. No. 61/618,049, filed Mar. 30, 2012, the entirety of which is hereby incorporated by reference herein.

BACKGROUND

A communication device in wireless communication with a base station may attempt to transmit data at a desired power level. However, due to various factors, such as a change in battery voltage, temperature variations, environmental changes, or other factors, the actual power level may differ or drift from the desired power level.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

The present disclosure provides systems, methods, and apparatus for controlling the output power of a transmitter. A non-limiting example is as follows. A communication device is in data communication with a base station. The communication device may be commanded by the base station to step from a current desired power level to a new desired power level. The communication device may then be configured to transmit at the new desired power level and begin transmitting data. The communication device may then determine the actual power level at which it is transmitting and adjust the actual power to match with the desired power level. The actual power level may initially be adjusted at a relatively fast rate. However, adjusting the actual power level at a relatively fast rate may distort a modulated signal. As such, after a predetermined time period of adjusting the actual power level at a relatively fast rate, the communication device may adjust the actual power level at a relatively slow rate. In the following discussion, a general description of the system and its components is provided, followed by a discussion of the operation of the same.

Figure 1:
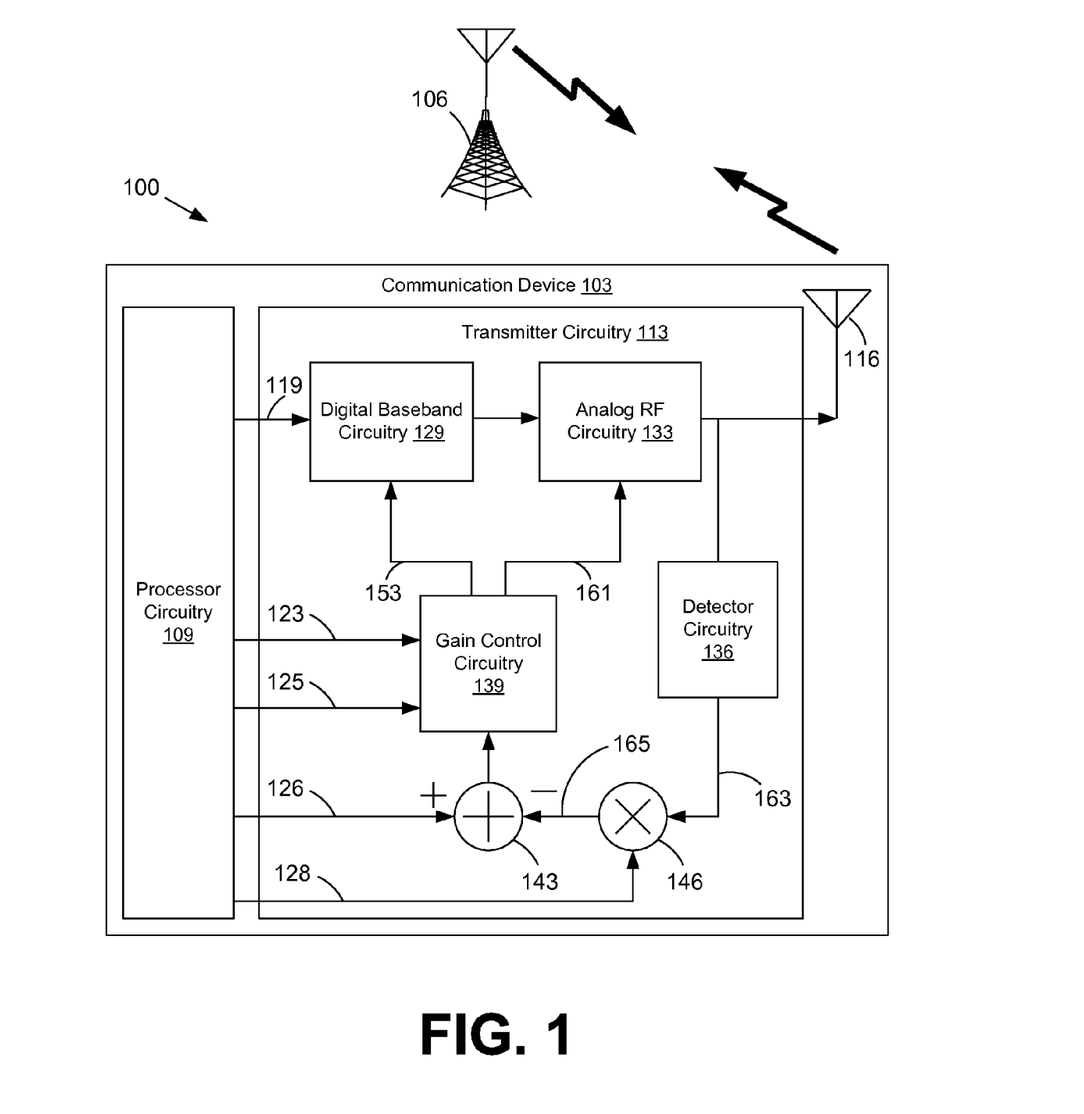
FIG. 1 is a drawing of a communication environment according to various embodiments of the present disclosure.

With reference to FIG. 1, shown is a drawing of a communication environment 100 according to various embodiments. The communication environment 100 includes a communication device 103 in wireless communication with a base station 106. The communication device 103 and base station 106 may be in wireless communication using, for example, a second-generation telecommunications protocol, a third-generation telecommunications protocol, a fourth-generation telecommunications protocol, and/or any other method of wireless communication.

The communication device 103 may comprise, for example, a processor-based system in a mobile computing device or other type of device. Such a mobile computing device may be embodied in the form of a cellular telephone, a web pad, a tablet computer system, a laptop computer, a netbook, an electronic book reader, a music player, a portable gaming device, or any other device with like capability. It is emphasized that the architecture of the communication device 103 shown in FIG. 1 is merely one example among others in accordance with the present disclosure.

The communication device 103 may include processor circuitry 109, transmitter circuitry 113, an antenna 116, and other components not discussed in detail herein. The processor circuitry 109 may, for example, process data, control various aspects of the communication device 103, and possibly perform other processes. For example, the processor circuitry 109 may output and control a data signal 119, a power adjustment enable signal 123, a power adjustment mode signal 125, a reference signal 126, a calibration signal 128, and other signals not discussed in detail herein.

The data signal 119 may be a digital version of the data that is later modulated and transmitted to the base station 106. For example, the data signal 119 may represent voice, messaging, control, or other types of data. The power adjustment enable signal 123 may cause various components of the transmitter circuitry 113 to be enabled or disabled, as will be described later.

The reference signal 126 is a signal that may be provided to the transmitter circuitry 113 and compared with a signal that corresponds to an actual power level of the transmitter circuitry 113, as will also be described later. Thus, the reference signal 126 may be equal to the signal that corresponds to the actual power level of the transmitter circuitry 113 when the actual power level is equal to the desired power level.

The calibration signal 128 may be provided to account for various factors that may affect the value of a signal representing the actual output power level of the transmitter circuitry 113. For instance, the calibration signal 128 may compensate for temperature, process, or other variations. As will be described later, the calibration signal 128 may be multiplied by the signal that corresponds to the actual output power level of the transmitter circuitry 113 in order to provide a signal that correctly represents the actual output power level.

The transmitter circuitry 113 may be configured to transmit wireless data at multiple desired power levels. To this end, the transmitter circuitry 113 may include, for example, digital baseband circuitry 129, analog radio frequency (RF) circuitry 133, detector circuitry 136, gain control circuitry 139, a subtractor 143, a multiplier 146, and other components not discussed in detail herein. The digital baseband circuitry 129 may act on a signal in the digital domain. Additionally, digital baseband circuitry 129 may include one or more multipliers configured to multiply the values of the data signal 119 with a digital gain signal 153 provided by the gain control circuitry 139. The output of the digital baseband circuitry 129 may be provided as an input to the analog RF circuitry 133.

The analog RF circuitry 133 may act on a signal in the analog domain and generate a signal suitable for transmission to the base station 106. For example, the analog RF circuitry 133 may include one or more preamplifiers, power amplifiers, mixers, modulators, and other components not discussed in detail herein for simplicity. Additionally, the analog RF circuitry 133 may include one or more mechanisms for adjusting the gain of an analog signal based on the analog gain signal 161 provided by the gain control circuitry 139. The output of the analog RF circuitry 133 may eventually be provided to the antenna 116 for transmission.

The detector circuitry 136 may be coupled to the output signal of the analog RF circuitry 133 and provide a power level signal 163, which represents an actual power level of the transmitted signal. To this end, the detector circuitry 136 may include, for example, a linear, logarithmic, or other type of peak-to-peak detector, envelope detector, directional coupler, or other type of detector. Additionally, the detector circuitry 136 may include one or more filters, analog-to-digital-converters, and possibly other components. In various alternative embodiments, the detector circuitry 136 may be a component of a power amplifier in the analog RF circuitry 133.

The power level signal 163 may be provided to the multiplier 146, which multiplies the power level signal 163 with the calibration signal 128 in order to provide a calibrated power level signal 165 that accounts for variations in temperature, battery voltage, or other factors. The calibrated power level signal 165 is then applied to the subtractor 143, which compares the calibrated power level signal 165 to the reference signal 126. The difference between the calibrated power level signal 165 and the reference signal 126 is then provided to the gain control circuitry 139.

The gain control circuitry 139 may control and adjust the actual power levels and desired power levels of signals output from the transmitter circuitry 113. To this end, the gain control circuitry 139 may provide the digital gain signal 153, analog gain signal 161, and possibly other signals to the digital baseband circuitry 129 and/or analog RF circuitry 133. The gain control circuitry 139 may adjust the actual power levels at multiple rates. For example, the gain control circuitry 139 may be designed to adjust the actual power level at a first adjustment rate and a second adjustment rate, wherein the second adjustment rate is slower than the first adjustment rate.

Additionally, the gain control circuitry 139 may be configured to adjust a digital gain of the digital baseband circuitry 129 at a first rate, a second rate, and a third rate, wherein the second rate is faster than the first rate and the third rate is slower than the first rate. Even further, the gain control circuitry 139 may be configured to adjust an analog gain of the analog RF circuitry 133 or maintain the analog gain at a fixed level. The particular rates of adjustment may be determined, for example, by the power adjustment mode signal 125. Additionally, the power adjustment enable signal 123 may enable and disable the process of adjusting the gains.

Next, a general description of the operation of the various components of the communication environment 100 is provided. To begin, it is assumed that the communication device 103 and the base station 106 are in data communication, and that the communication device 103 is transmitting data at a first desired output level. Thus, as a non-limiting example, the communication device 103 may be transmitting at a desired output level of 0 dB.

For various reasons, the base station 106 may transmit a command to the communication device 103 requesting that the communication device 103 change or step to a new desired output power level. Thus, as a non-limiting example, the command may request that the communication device 103 begin transmitting at 1 dB.

In response to the command, the processor circuitry 109 may configure the transmitter circuitry 113 to transmit at the new desired power level, and the communication device 103 may begin transmitting data. The detector circuitry 136, using an envelope detector or directional coupler for example, may obtain a signal corresponding to the actual power level of the transmitter circuitry 113. Various processing, such as filtering, analog-to-digital conversion, and/or possibly other processing, may be performed on the signal.

The power level signal 163 may be provided to the multiplier 146 for adjustment based on the calibration signal 128. For instance, the calibration signal 128 may account for temperature, process, or other types of variations. The calibrated power level signal 165 from the multiplier 146 may then be compared to reference signal 126 using the subtractor 143, and the resulting signal may be applied to the gain control circuitry 139. Thus, in the event that the actual power level of the transmitter circuitry 113 is higher than the desired power level, the comparison of the calibrated power level signal 165 from the multiplier 146 and the reference signal 126 may result in the gain control circuitry 139 receiving a signal that indicates that the actual power level is to be reduced. To the contrary, in the event that the actual power level is lower than the desired power level, the comparison of the calibrated power level signal 165 from the multiplier 146 and the reference signal 126 may result in the gain control circuitry 139 receiving a signal that indicates that the actual power level is to be increased.

Based on the signal from the subtractor 143, the gain control circuitry 139 may determine adjustment amounts and adjust the actual power level at various adjustment rates. For example, the gain control circuitry may adjust the actual output power at a first adjustment rate for a predetermined time period. The predetermined time period may be based on, for example, the time when the communication device 103 changes to the new desired power level and a time when the base station 106 begins to measure the power level from the communication device 103. Additionally, the predetermined time period may be programmable.

In order to adjust the actual power level, the gain control circuitry 139 may increase or decrease the values for the analog gain signal 161 and/or the digital gain signal 153 based on the signal received from the subtractor 143. In various embodiments, adjusting the actual power level may involve changing the values of coefficients or registers for various filters or other components of the analog RF circuitry 133 and/or digital baseband circuitry 129. In further various embodiments, adjusting the actual power level may involve the use of one or more look-up tables.

Adjusting the actual power level at different rates may be accomplished in various ways. For example, adjusting the actual power level at a first adjustment rate may involve updating gain signals (e.g., the digital gain signal 153 and the analog gain signal 161) at a particular frequency, while adjusting the actual power level at the second adjustment rate may involve updating gain signals at a different frequency. In alternative embodiments, the differing adjustment rates may be accomplished by having different step amounts (i.e., the difference from one value to another value) for the corresponding adjustment rates.

Upon an expiration of the predetermined time period, the gain control circuitry 139 may switch from adjusting the actual power level at the first adjustment rate to adjusting the actual power level at a second adjustment rate. The second adjustment rate may be slower than the first adjustment rate, for example. By switching to the second adjustment rate that is slower than the first adjustment rate, distortion to the outputted data signal may be reduced.

In further various embodiments, the predetermined time period may be segmented into a first time segment and a second time segment. During the first time segment, the gain control circuitry 139 may adjust a gain for the digital baseband circuitry 129 at a first rate. During the second time segment, the gain control circuitry 139 may adjust the gain for the digital baseband circuitry 129 at a second rate. The second rate may be slower than the first rate, for example.

Additionally, a gain for the analog RF circuitry 133 may be adjusted during the first time segment. The rate at which the gain for the analog RF circuitry 133 may be adjusted may be faster than the rate at which the gain for the digital baseband circuitry 129 is adjusted during the first time period, for example. During the second time segment, the gain control circuitry 139 may maintain the gain for the analog RF circuitry 133 at a fixed level. After the expiration of the predetermined time period, the gain for the analog RF circuitry 133 may be maintained at a fixed level, and the gain for the digital baseband circuitry 129 may be adjusted at a third rate. The third rate may be slower than the first rate, for example. By adjusting the gain of the digital baseband circuitry 129 at the first rate while the gain for the analog RF circuitry 133 is being adjusted, then adjusting the gain for the digital baseband circuitry 129 at the second rate while the gain for the analog RF circuitry 133 is maintained at the fixed value, then adjusting the digital baseband circuitry 129 at the third rate while the gain for the analog RF circuitry 133 is maintained at the fixed value, an improved error vector magnitude (EVM) performance of the transmitter circuitry 113 may be realized.

Additionally, the adjustment of the actual power level may be disabled prior to an initiation of the predetermined time period, and the gain for the digital baseband circuitry 129 and the gain for the analog RF circuitry 133 may be brought to an initialized level. By bringing the gains for the digital baseband circuitry 129 and the analog RF circuitry 133 to the initialized level, the adjustments that begin upon switching to the new desired power level may instead begin at the initialized level and prevent adjustments that may be unnecessary. Additionally, it is noted that the amount of time for which the gain remains at the initialized level may also be predetermined.

It may be the case that the dynamic range of the detector circuitry 136 may not encompass the full dynamic range of the transmitter circuitry 113. As such, the transmitter circuitry 113 may be configured to stop (i.e., disable) adjusting the actual power level in the event that the desired power level change is at a level that is outside of the range of the detector circuitry 136. For example, the adjusting of the actual power level may be disabled in the case where the desired power level is being switched from a relatively high desired power level to a relatively low desired power level. Similarly, the transmitter circuitry 113 may be configured to enable adjusting the actual power level in the event that the desired power level is switched from a level that is outside of the detector circuitry 136 to level range that is within the range the detector circuitry 136.

Figure 2A:
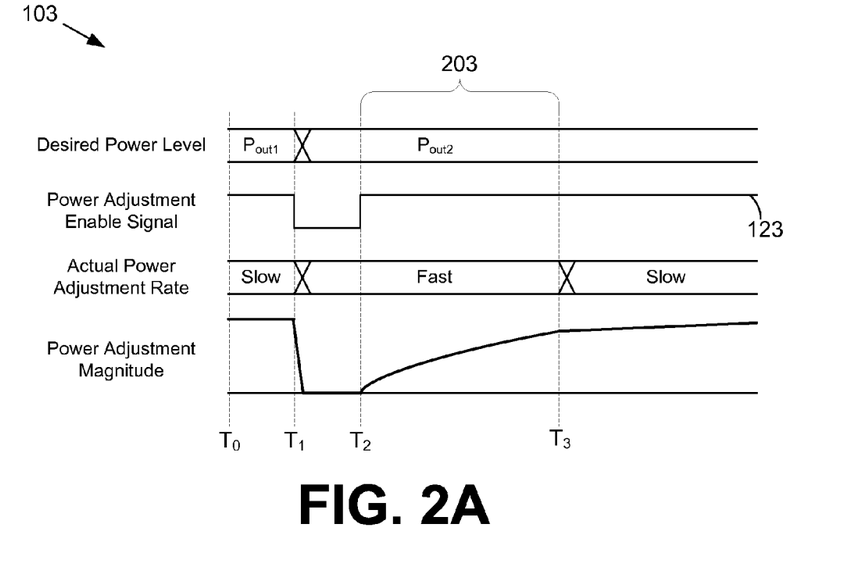
FIGS. 2A-2D are timing diagrams illustrating examples of functionality implemented in a communication device in the communication environment of FIG. 1 according to various embodiments of the present disclosure.

Referring next to FIG. 2A, shown is a timing diagram illustrating examples of functionality implemented in the communication device 103 according to various embodiments of the present disclosure. The timing diagram of FIG. 2A is merely an example of the various functionality that is performed in the communication device 103.

The timing diagram shows the desired output level, the power adjustment enable signal 123, the actual power adjustment rate, and the power adjustment magnitude beginning at time $T_0$. Additionally, the predetermined time period (referred to herein as the predetermined time period 203) is shown.

From time $T_0$ to time $T_1$, the desired power level has been at the level $P_{out1}$, the power adjustment enable signal 123 is TRUE, and the actual power adjustment rate is at a relatively slow rate. At time $T_1$, a command to change to a new desired power level has been received, and the transmitter circuitry 113 (FIG. 1) switches to the new desired power level $P_{out2}$. Also at time $T_1$, the power adjustment enable signal 123 becomes FALSE, and the actual adjustment rate switches to a relatively fast rate. Also, the power adjustment magnitude falls to zero dB, because the power adjustment enable signal 123 has become FALSE.

At time $T_2$, the power adjustment enable signal 123 becomes TRUE, and the predetermined time period 203 begins. Because the actual power adjustment rate is relatively fast, the power adjustment magnitude raises relatively fast in the example shown. At time $T_3$, the predetermined time period 203 has expired, and the actual power adjustment rate switches to a relatively slow rate. Because the actual power adjustment rate has switched to a relatively slow rate, the power adjustment magnitude increases at a relatively slow rate in the example shown.

Figure 2B:
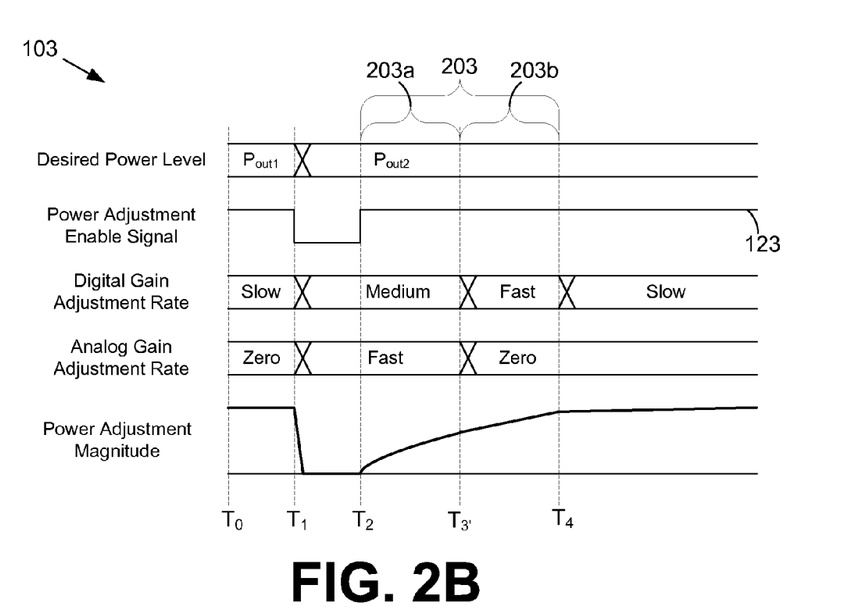

Turning now to FIG. 2B, shown is another timing diagram illustrating examples of functionality implemented in the communication device 103 according to various embodiments of the present disclosure. It is emphasized that the timing diagram of FIG. 2B is merely an example of the various functionality that is performed in the communication device 103.

The timing diagram shows the desired output level, the power adjustment enable signal 123, the digital gain adjustment rate, the analog gain adjustment rate, and the power adjustment magnitude beginning at time $T_0$. Additionally, the predetermined time period 203 has been segmented into a first time segment 203a and a second time segment 203b.

From time $T_0$ to time $T_1$, the desired power level has been at the level $P_{out1}$, the power adjustment enable signal 123 is TRUE, the digital gain adjustment rate is relatively slow and the analog gain adjustment rate is zero. At time $T_1$, a command to change to a new desired power level has been received, and the transmitter circuitry 113 (FIG. 1) switches to the new desired power level $P_{out2}$. Also at time $T_1$, the power adjustment enable signal 123 becomes FALSE, the digital gain adjustment rate switches to a relatively medium speed (i.e., between a fast speed and a low speed), and the analog gain adjustment rate switches to a relatively fast rate. Also, the power adjustment magnitude falls zero, because a unity gain amount is being applied to the digital gain and the analog gain.

At time $T_2$, the power adjustment enable signal 123 becomes TRUE, and the predetermined time period 203 (and thus the first time segment 203a) begins. The digital gain adjustment rate is at a relatively medium speed, and the analog gain adjustment rate is at a relatively fast speed. Thus, the power adjustment magnitude raises relatively fast in the example shown. At time $T_3$, the first time segment 203a ends, and the second time segment 203b begins. At this time, the digital gain adjustment rate switches to a relatively fast rate and the analog gain adjustment rate switches to zero. It is noted that the "fast" digital gain adjustment rate and the "fast" analog gain adjustment rate may or may not be the same rate. In the example shown, the power adjustment magnitude also increases at a relatively fast rate during this period.

At time $T_4$, the predetermined time period 203 (and thus the second time segment 203b) has expired, and the digital gain adjustment rate switches to a relatively slow rate. Also, the analog gain adjustment rate remains at zero. Accordingly, the power adjustment magnitude increases at a relatively slow rate in the example shown.

Figure 2C:
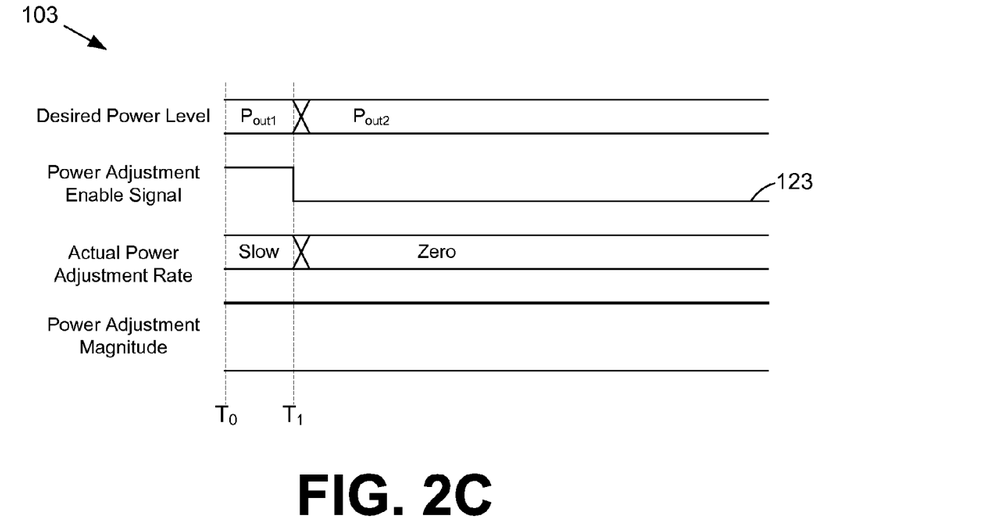

Turning now to FIG. 2C, shown is another timing diagram illustrating examples of functionality implemented in the communication device 103 according to various embodiments of the present disclosure. The timing diagram of FIG. 20 is merely an example of the various functionality that is performed in the communication device 103.

Beginning at time $T_0$, the communication device 103 transmits at the desired power level $P_{out1}$. The power adjustment enable signal 123 is TRUE, and the actual power adjustment rate is at a relatively slow adjustment rate. At time $T_1$, the communication device 103 switches to a new desired power level $P_{out2}$, in response to a command obtained from the base station 106 (FIG. 1). In the present example, the new desired power level $P_{out2}$ is outside of the dynamic range at which the detector circuitry 136 (FIG. 1) can detect. Thus, the power adjustment enable signal 123 becomes FALSE, and the actual power adjustment rate is stopped. As such, the power adjustment magnitude remains at the same level from the time $T_0$.

Figure 2D:
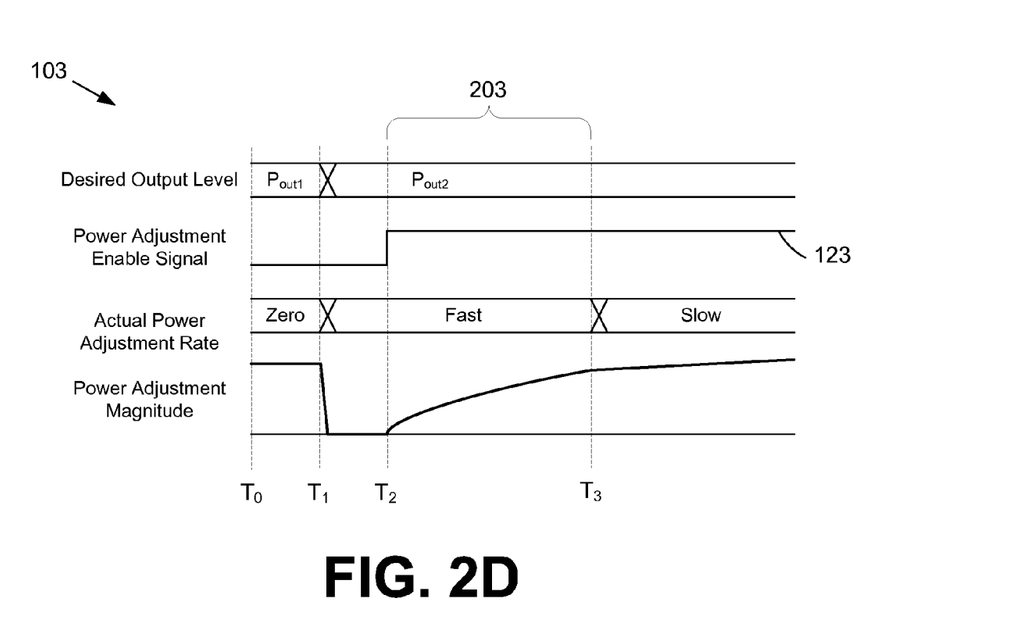

Moving on to FIG. 2D, shown is a timing diagram illustrating examples of functionality implemented in the communication device 103 according to various embodiments of the present disclosure. The timing diagram of FIG. 2D is merely an example of the various functionality that is performed in the communication device 103.

The timing diagram shows the desired output level, the power adjustment enable signal 123, the actual power adjustment rate, and the power adjustment magnitude beginning at time $T_0$. Additionally, the predetermined time period 203 is shown.

From time $T_0$ to time $T_1$, the desired power level has been at the level $P_{out1}$, the power adjustment enable signal 123 is FALSE, and the actual power adjustment rate is at zero. At time $T_1$, a command to change to a new desired power level has been received, and the transmitter circuitry 113 (FIG. 1) switches to the new desired power level $P_{out2}$. In the present example, the first desired power level $P_{out1}$ was outside of the dynamic range of the detector circuitry 136, but the new desired power level $P_{out2}$ is within the dynamic range of the detector circuitry 136. At time $T_1$, the actual adjustment rate switches to a relatively fast rate. Also, the power adjustment magnitude falls zero, because an initialized level of gain is being applied to the digital gain and the analog gain.

At time $T_2$, the power adjustment enable signal 123 becomes TRUE, and the predetermined time period 203 begins. Because the actual power adjustment rate is relatively fast, the power adjustment magnitude raises relatively fast in the example shown. At time $T_3$, the predetermined time period 203 has expired, and the actual power adjustment rate switches to a relatively slow rate. Because the actual power adjustment rate has switched to a relatively slow rate, the power adjustment magnitude increases at a relatively slow rate in the example shown.

Figure 3A:
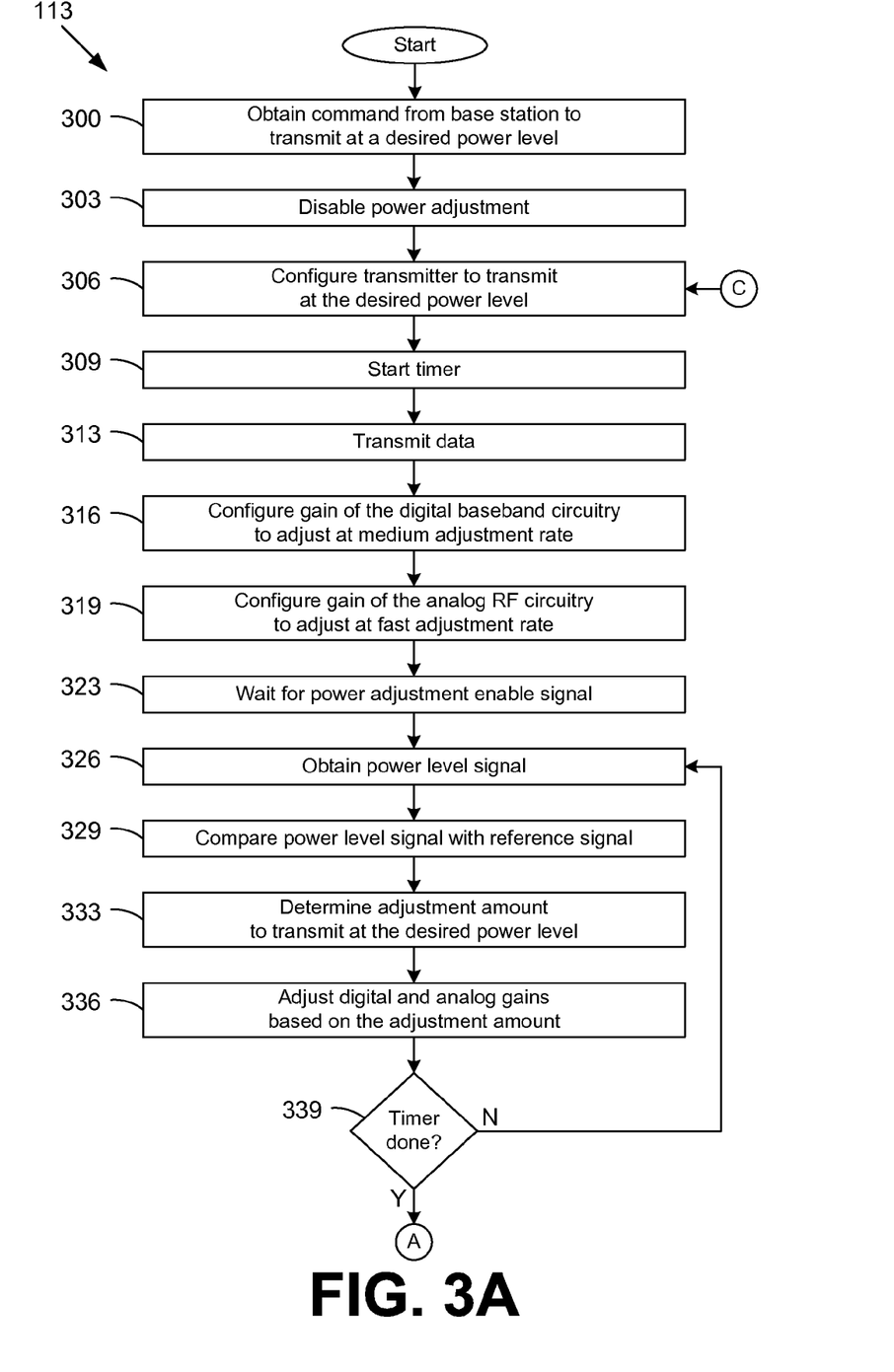
FIGS. 3A-3C is a flowchart illustrating an example of functionality executed in a communication device in the communication environment of FIG. 1 according to various embodiments of the present disclosure.
Figure 3B:
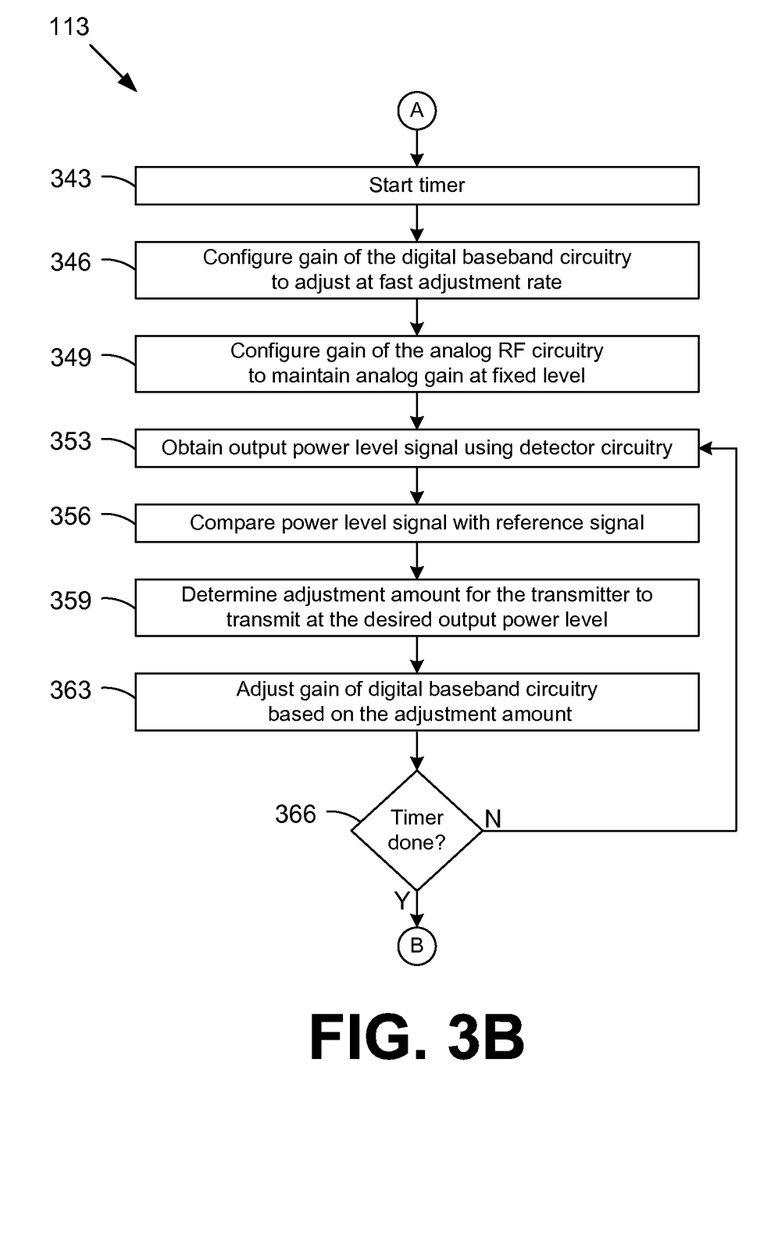
Figure 3C:
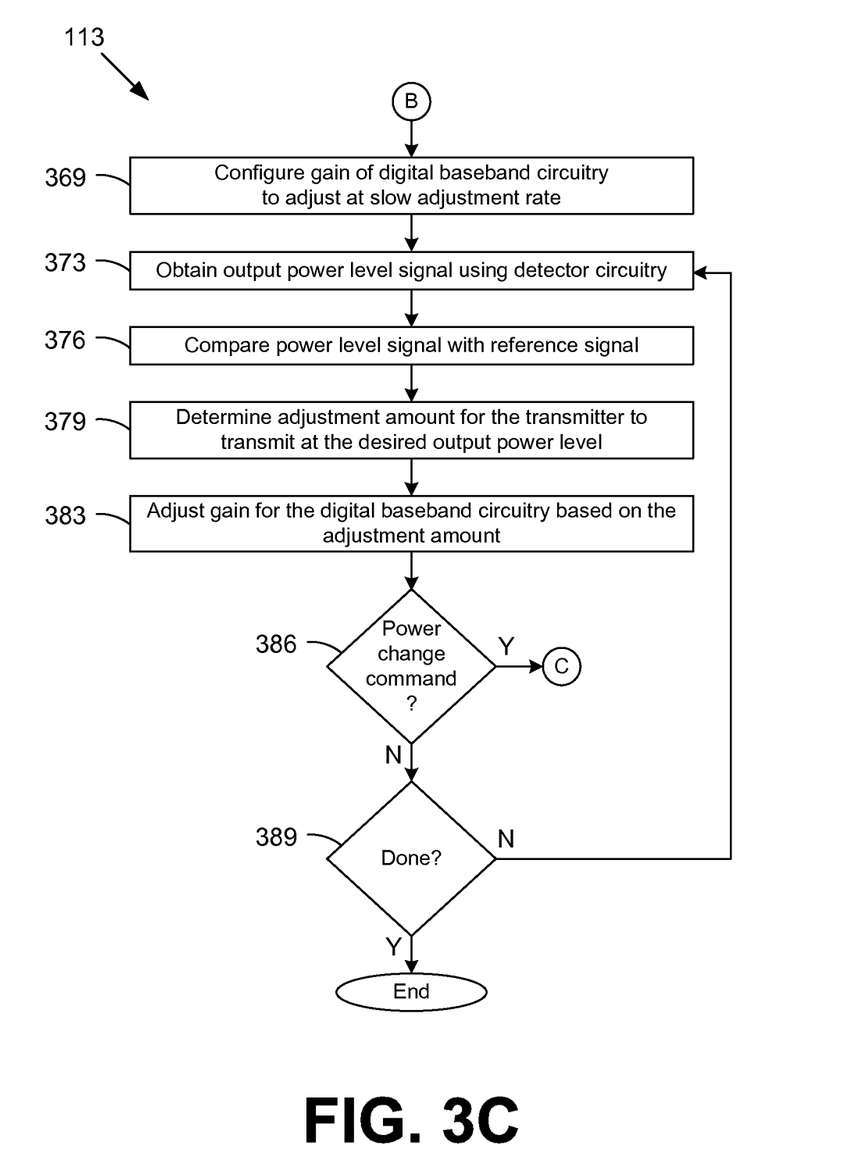

Referring next to FIGS. 3A-3C, shown is a flowchart that provides one example of the operation of a portion of the transmitter circuitry 113 according to various embodiments. It is understood that the flowchart of FIGS. 3A-3C provides merely an example of the many different types of functional arrangements that may be employed to implement the operation of the portion of the transmitter circuitry 113 as described herein. As an alternative, the flowchart of FIGS. 3A-3C may be viewed as depicting an example of steps of a method implemented in the communication device 103 (FIG. 1) according to one or more embodiments.

Beginning with block 300, the transmitter circuitry 113 obtains a command from the base station 106 (FIG. 1) to transmit at a desired power level. Next, as shown in block 303, the power adjustment of at least a portion of the transmitter circuitry 113 is disabled. To this end, the power adjustment enable signal 123 may be set to FALSE. The transmitter circuitry 113 is then configured to begin transmitting at the desire power level, as depicted in block 306.

As shown in block 309, a timer is started. The transmitter circuitry 113 then transmits data, as depicted in block 313. The transmitter circuitry 113 then moves to block 316 and configures the gain of the digital baseband circuitry 129 (FIG. 1) to be adjusted at a relatively medium adjustment rate. As shown in block 319, the gain of the analog RF circuitry 133 (FIG. 1) is also configured to adjust at a relatively fast adjustment rate, and the transmitter circuitry 113 waits for the power adjustment enable signal 123 (FIG. 1) to be TRUE, as shown in block 323.

Upon the power adjustment enable signal 123 being TRUE, the predetermined time period is initiated. As depicted in block 326, the power level signal 163 is obtained and then compared with the reference signal 126, as shown in block 329. Thereafter, the adjustment amount for the transmitter circuitry 113 to transmit at the desired power level is determined, as shown in block 333.

Moving to block 336, the transmitter circuitry 113 adjusts the gains of the digital baseband circuitry 129 and the analog RF circuitry 133 based on the adjustment amount. The transmitter circuitry 113 then moves to block 339 and determines whether the timer has expired. If the timer has not expired, the transmitter circuitry returns to block 326, and the process is repeated as shown. Upon the timer expiring, the transmitter circuitry moves to block 343. Thus, from block 326 to block 339, the transmitter circuitry 113 adjusts an analog gain during a first time segment of the predetermined time period. Further, from block 326 to block 339, the transmitter circuitry 113 adjusts a digital gain at a first rate during the first time segment.

Moving now to block 343, the timer is restarted, and the gain of the digital baseband circuitry 129 is configured to be adjusted at a relatively fast adjustment rate, as shown in block 346. Next, as shown in block 349, the gain of the analog RF circuitry 133 is configured to be maintained at a fixed level. Thereafter, the power level signal 163 is obtained, as depicted in block 353, and then compared with the reference signal 126, as shown in block 356. Thereafter, the transmitter circuitry 113 moves to block 359, and the adjustment amount for the transmitter circuitry 113 to transmit at the desired power level is determined. The gain of the digital baseband circuitry 129 is then adjusted based on the adjustment amount, as shown in block 363.

The transmitter circuitry 113 then moves to box 366 and determines whether the timer has expired. If the timer has not expired, the transmitter circuitry 113 returns to box 353 and the process is repeated at shown. Thus, from block 353 to block 366, a digital gain is adjusted at a second rate for the second time segment, wherein the second rate is faster than the first rate. Also, from block 353 to block 366, an analog gain is maintained at a fixed level for the second time segment. Additionally, from block 326 to block 366, the transmitter circuitry 113 adjusts, for a predetermined time period and at a first adjustment rate, an actual power level of the transmitter circuitry 113 based on a plurality of adjustment amounts.

Moving now to block 369, the transmitter circuitry 113 then configures a gain of the digital baseband circuitry 129 to adjust at a relatively slow adjustment rate. As shown in block 373, an output power level signal is obtained using the detector circuitry 136, and the power level signal 163 is compared with the reference signal 126, as depicted in block 376. An adjustment amount in order for the transmitter circuitry 113 to transmit at the desired output level is then determined, as shown in block 379. Thereafter, in block 383, a gain for the digital baseband circuitry 129 is adjusted based on the adjustment amount.

As shown in block 386, the transmitter circuitry 113 then determines whether there has been a power change command from the base station 106 (FIG. 1) that has been received by the communication device 103. If so, the transmitter circuitry 113 returns to block 306, and the process is repeated as shown. Otherwise, the transmitter circuitry 113 moves to block 389, and it is determined whether the process is complete. The process may be complete, for example, upon the transmitter circuitry 113 being powered down. If the process is not complete, the transmitter circuitry returns to block 373, and the process is repeated as shown. Thus, from block 369 to block 379, upon an expiration of a predetermined time period, an actual power level is adjusted at a second adjustment rate based on a plurality of adjustment amounts.

The flowchart of FIG. 3A-3C shows the functionality and operation of an implementation of portions of the transmitter circuitry 113 (FIG. 1). If portions are embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor circuitry 109 (FIG. 1). The machine code may be converted from the source code, etc. If embodied in hardware, each block may represent a circuit or a number of interconnected circuits to implement the specified logical function(s).

Although the flowchart of FIGS. 3A-3C shows a specific order of execution, it is understood that the order of execution may differ from that which is depicted. For example, the order of execution of two or more blocks may vary relative to the order shown. Also, two or more blocks shown in succession in FIGS. 3A-3C may be executed concurrently or with partial concurrence. Further, in some embodiments, one or more of the blocks shown in FIGS. 3A-3C may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Various systems described herein may be embodied in general-purpose or dedicated hardware or a combination of software, general-purpose hardware, and/or dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, one or more programmable logic devices (e.g., a field programmable gate array (FPGA), a complex programmable logic device (CPLD), etc.), or other components, etc. Such technologies are generally well known by those skilled in the art and, consequently, are not described in detail herein.

It is emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A system, comprising:
    transmitter circuitry configured to transmit data at a plurality of desired power levels;
    detector circuitry configured to obtain a signal corresponding to an actual transmit power level for transmitted data;
    gain control circuitry configured to adjust the actual transmit power level based on the signal at a first adjustment rate for a predetermined time period in response to receiving a command to change to one of the desired power levels; and
    the gain control circuitry configured to adjust the actual transmit power level based on the signal at a second adjustment rate upon an expiration of the predetermined time period, wherein adjusting the actual transmit power level at the first and the second adjustment rates comprises updating gain signals at a first and a second frequency.

2. The system of claim 1, wherein the predetermined time period further comprises a first time segment and a second time segment;
    wherein the gain control circuitry is further configured to:
    adjust a digital gain at a first rate for the first time segment;
    adjust an analog gain for the first time segment;
    adjust the digital gain at a second rate for the second time segment, the second rate being faster than the first rate; and
    maintain the analog gain at a fixed level for the second time segment.

3. The system of claim 2, wherein the gain control circuitry is further configured to adjust the digital gain at a third rate, the third rate being slower than the first adjustment rate.

4. The system of claim 1, wherein the transmitter circuitry is configured to disable a power adjustment in response to receiving the command to change to one of the desired power levels and prior to an initiation of the predetermined time period.

5. The system of claim 1, wherein the transmitter circuitry is configured to stop an adjustment of the actual transmit power level upon obtaining the command to switch to a decreased desired power level, the command being obtained from a base station.

6. The system of claim 5, wherein the transmitter circuitry is configured to initiate the adjustment of the actual transmit power level upon obtaining the command to switch to an increased desired power level, the command being obtained from the base station.

7. An apparatus, comprising:
    gain control circuitry configured to adjust an actual transmit power level of a transmitter at a first adjustment rate for a predetermined time period in response to receiving a command to change a desired power level; and
    the gain control circuitry further configured to adjust the actual transmit power level of the transmitter at a second adjustment rate upon an expiration of the predetermined time period, wherein adjusting the actual transmit power level at the first and the second adjustment rates comprises updating gain signals at a first and a second frequency.

8. The apparatus of claim 7, wherein the predetermined time period further comprises a first time segment and a second time segment;
    wherein the gain control circuitry is further configured to:
    adjust a digital gain of the transmitter at a first rate during the first time segment;

adjust an analog gain of the transmitter during the first time segment;

adjust the digital gain of the transmitter at a second rate during the second time segment, the second rate being faster than the first rate; and maintain the analog gain of the transmitter at a fixed level during the second time segment.

9. The apparatus of claim 8, further comprising transmitter circuitry configured to disengage a power adjustment in response to receiving the command to change the desired power level and prior to an initiation of the predetermined time period.

10. The apparatus of claim 7, wherein the predetermined time period is programmable.

11. The apparatus of claim 7, further comprising:
detector circuitry configured to obtain a reference signal and an power level signal for the transmitter;
the gain control circuitry configured to determine a plurality of adjustment amounts based on the reference signal and the power level signal; and
wherein the gain control circuitry is further configured to adjust the actual transmit power level based on the adjustment amounts.

12. The apparatus of claim 7, further comprising transmitter circuitry configured to stop an adjustment of the actual transmit power level upon obtaining the command to decrease the desired power level, the command being obtained from a base station.

13. The apparatus of claim 12, wherein the transmitter circuitry is configured to initiate the adjustment of the actual transmit power level upon obtaining the command to increase the desired power level, the command being obtained from the base station.

14. A method, comprising:
determining, in a circuit, a plurality of adjustment amounts for a transmitter to transmit at a desired power level;
adjusting, in the circuit, for a predetermined time period and at a first adjustment rate, an actual transmit power level of the transmitter based on a plurality of the adjustment amounts; and
upon an expiration of the predetermined time period, adjusting, in the circuit, at a second adjustment rate, the actual transmit power level based on a plurality of the adjustment amounts, the second adjustment rate being slower than the first adjustment rate, wherein adjusting the actual transmit power level at the first and the second adjustment rates comprises updating gain signals at a first and a second frequency.

15. The method of claim 14, wherein determining each of the adjustment amounts for the transmitter further comprises determining a difference between a reference signal and a power level signal for the transmitter.

16. The method of claim 14, wherein the predetermined time period further comprises a first time segment and a second time segment; and
wherein adjusting for the predetermined time period at the first adjustment rate further comprises:
adjusting an analog gain during the first time segment;
adjusting a digital gain at a first rate during the first time segment;
maintaining the analog gain at a fixed level during the second time segment; and
adjusting the digital gain at a second rate during the second time segment, the second rate being faster than the first rate.

17. The method of claim 14, further comprising disabling a power adjustment in response to receiving a command to change the desired power level and prior to an initiation of the predetermined time period.

18. The method of claim 14, wherein adjusting for the predetermined time period at the first adjustment rate is initiated in response to obtaining a command from a base station to adjust the desired power level.

19. The method of claim 14, further comprising stopping an adjustment of the actual transmit power level upon obtaining a command to decrease the desired power level, the command being obtained from a base station.

20. The method of claim 19, further comprising initiating the adjustment of the actual transmit power level upon obtaining the command to increase the desired power level, the command being obtained from the base station.

* * * * *